United States Patent
Kim et al.

(10) Patent No.: US 10,958,858 B2
(45) Date of Patent: Mar. 23, 2021

(54) RAMP SIGNAL GENERATOR AND IMAGE SENSOR INCLUDING THE SAME

(71) Applicant: SK hynix Inc., Icheon-si (KR)

(72) Inventors: Jin Seon Kim, Seoul (KR); Min Seok Shin, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 16/391,126

(22) Filed: Apr. 22, 2019

(65) Prior Publication Data

US 2020/0213547 A1 Jul. 2, 2020

(30) Foreign Application Priority Data

Dec. 28, 2018 (KR) .................... 10-2018-0171453

(51) Int. Cl.
*H04N 5/363* (2011.01)
*H03M 1/56* (2006.01)
*H04N 5/374* (2011.01)
*H04N 5/378* (2011.01)

(52) U.S. Cl.
CPC ............ *H04N 5/363* (2013.01); *H03M 1/56* (2013.01); *H04N 5/374* (2013.01); *H04N 5/378* (2013.01)

(58) Field of Classification Search
CPC ......... H03M 1/56; H04N 5/363; H04N 5/374; H04N 5/378
See application file for complete search history.

(56) References Cited

U.S. PATENT DOCUMENTS

| | | |
|---|---|---|
| 9,578,268 B2 | 2/2017 | Kim et al. |
| 9,736,408 B2 | 8/2017 | Kim |
| 2007/0080838 A1* | 4/2007 | Asayama ............ H03M 1/0863 341/144 |
| 2009/0021411 A1* | 1/2009 | Maruyama ............. H04N 5/374 341/155 |
| 2009/0033759 A1* | 2/2009 | Wakabayashi ......... H04N 5/335 348/222.1 |
| 2015/0171841 A1* | 6/2015 | Lee ........................ H03K 4/26 327/126 |
| 2016/0021323 A1* | 1/2016 | Aibara ................... H03K 4/502 348/294 |
| 2017/0064237 A1* | 3/2017 | Aibara ................... H04N 5/378 |
| 2017/0195601 A1* | 7/2017 | Yun .................... H04N 5/37455 |

* cited by examiner

*Primary Examiner* — Amy R Hsu
(74) *Attorney, Agent, or Firm* — Perkins Coie LLP

(57) ABSTRACT

Disclosed are devices, systems and methods for allowing a ramp signal generator to reduce noise. A ramp signal generator may include a reference voltage generator configured to generate a reference voltage, a gain controller configured to control a gain of the reference voltage, a ramp signal controller configured to generate a ramp signal in response to an output signal of the gain controller, and an offset controller coupled to an output terminal of the gain controller in the form of a current mirror, and control an offset of the ramp signal in response to a control signal.

20 Claims, 4 Drawing Sheets

RAMP SIGNAL GENERATOR AND IMAGE SENSOR INCLUDING THE SAME

CROSS-REFERENCE TO RELATED APPLICATION

This patent document claims the priority and benefits of Korean patent application No. 10-2018-0171453, filed on Dec. 28, 2018, the disclosure of which is hereby incorporated in its entirety by reference herein.

TECHNICAL FIELD

Embodiments of the present disclosure generally relate to a ramp signal generator and an image sensor including the same, and more particularly to a technology for allowing a ramp signal generator to reduce noise.

BACKGROUND

The complementary metal oxide semiconductor (CMOS) technology has been adopted to design and fabricate sensors in the field of imaging where the charge coupled device (CCD) dominated most of image sensing devices in the past decades. A CMOS image sensor (CIS) has traditionally had lower image quality compared to the CCD. However, the CIS is rapidly reaching parity with the CCD in image quality and is expanding rapidly into the image sensor market thanks to their low power consumption, low price, and small size. Notably, the CIS allows video cameras to record at high quality and high frame rate and is now also expanding into the video camera market.

The CIS includes, among others, an analog-to-digital converter (ADC) to convert analog signals (pixel signals) generated from a pixel array into digital signals.

The correlated double sampling can improve the signal to noise ratio by subtracting a reference output signal from the actual signal of the pixel. The ADC performs the analog-to-digital conversion using the resultant signal of the correlated double sampling. After performing the correlated double sampling on an analog output voltage generated by the image sensor pixel array, the ADC compares the resultant signal with a ramp signal generated by a ramp signal generator, providing a comparison signal for generating a digital code.

However, the noise generated by the ramp signal generator and transmitted to the ADC can still impact on the image quality of the CMOS image sensor (CIS).

SUMMARY

This patent document provides, among others, designs of an analog-to-digital converter and an image sensor that can improve image quality by minimizing the noise generated by a ramp signal generator of the analog-to-digital converter.

Some embodiments of the disclosed technology relate to a ramp signal generator for reducing noise by precisely adjusting an offset of a ramp signal.

In an embodiment of the disclosed technology, a ramp signal generator may include a reference voltage generator configured to generate a reference voltage, a gain controller configured to control a gain of the reference voltage, a ramp signal controller configured to generate a ramp signal in response to an output signal of the gain controller, and an offset controller coupled to an output terminal of the gain controller to form a current mirror and configured to control an offset of the ramp signal in response to a control signal.

In another embodiment of the disclosed technology, an image sensor may include a pixel array including imaging pixels arranged relative to one another in an array and configured to respond to incident to output a plurality of pixel signals corresponding to received incident light, a ramp signal generator configured to generate a ramp signal, and an analog-to-digital converter (ADC) circuit in communication with the pixel array and the ramp signal generator and configured to convert the plurality of pixel signals into digital signals using the ramp signal. The ramp signal generator may include a reference voltage generator configured to generate a reference voltage, a gain controller configured to control a gain of the reference voltage, a ramp signal controller configured to generate the ramp signal in response to an output signal of the gain controller, and an offset controller coupled to an output terminal of the gain controller to form a current mirror and configured to control an offset of the ramp signal in response to a control signal.

In another embodiment of the disclosed technology, a ramp signal generator includes a reference voltage generator configured to generate a reference voltage, a gain controller coupled to the reference voltage generator to control a gain of the reference voltage, a ramp signal controller coupled to the gain controller to generate a ramp signal in response to an output signal of the gain controller, and an offset controller coupled to the ramp signal controller and an output terminal of the gain controller to form a current mirror and configured to control an offset of the ramp signal in response to a control signal.

In another embodiment of the disclosed technology, an image sensor includes a pixel array including imaging pixels arranged relative to one another in an array and configured to respond to incident light to output a plurality of pixel signals corresponding to received incident light, a ramp signal generator configured to generate a ramp signal, and an analog-to-digital converter (ADC) circuit in communication with the pixel array and the ramp signal generator and configured to convert the plurality of pixel signals into digital signals using the ramp signal. The ramp signal generator includes a reference voltage generator configured to generate a reference voltage, a gain controller coupled to the reference voltage generator to control a gain of the reference voltage, a ramp signal controller coupled to the gain controller to generate the ramp signal in response to an output signal of the gain controller, and an offset controller coupled to the ramp signal controller and an output terminal of the gain controller to form a current mirror and configured to control an offset of the ramp signal in response to a control signal.

In another embodiment of the disclosed technology, a ramp signal generator may include a reference voltage generator configured to generate a reference voltage, a gain controller configured to control a gain of the reference voltage, a ramp signal controller configured to generate a ramp signal in response to an output signal of the gain controller, and an offset controller coupled to an output terminal of the gain controller in the form of a current mirror, and control an offset of the ramp signal in response to a control signal.

In another embodiment of the disclosed technology, an image sensor may include a pixel array configured to output a plurality of pixel signals corresponding to incident light, a ramp signal generator configured to generate a ramp signal, and an analog-to-digital converter (ADC) circuit configured to convert the plurality of pixel signals into digital signals in response to the ramp signal. The ramp signal generator may include a reference voltage generator configured to generate a reference voltage, a gain controller configured to control a gain of the reference voltage, a ramp signal controller configured to generate the ramp signal in response to an output signal of the gain controller, and an offset controller coupled to an output terminal of the gain controller in the form of a current mirror, and control an offset of the ramp signal in response to a control signal.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Figure 1:
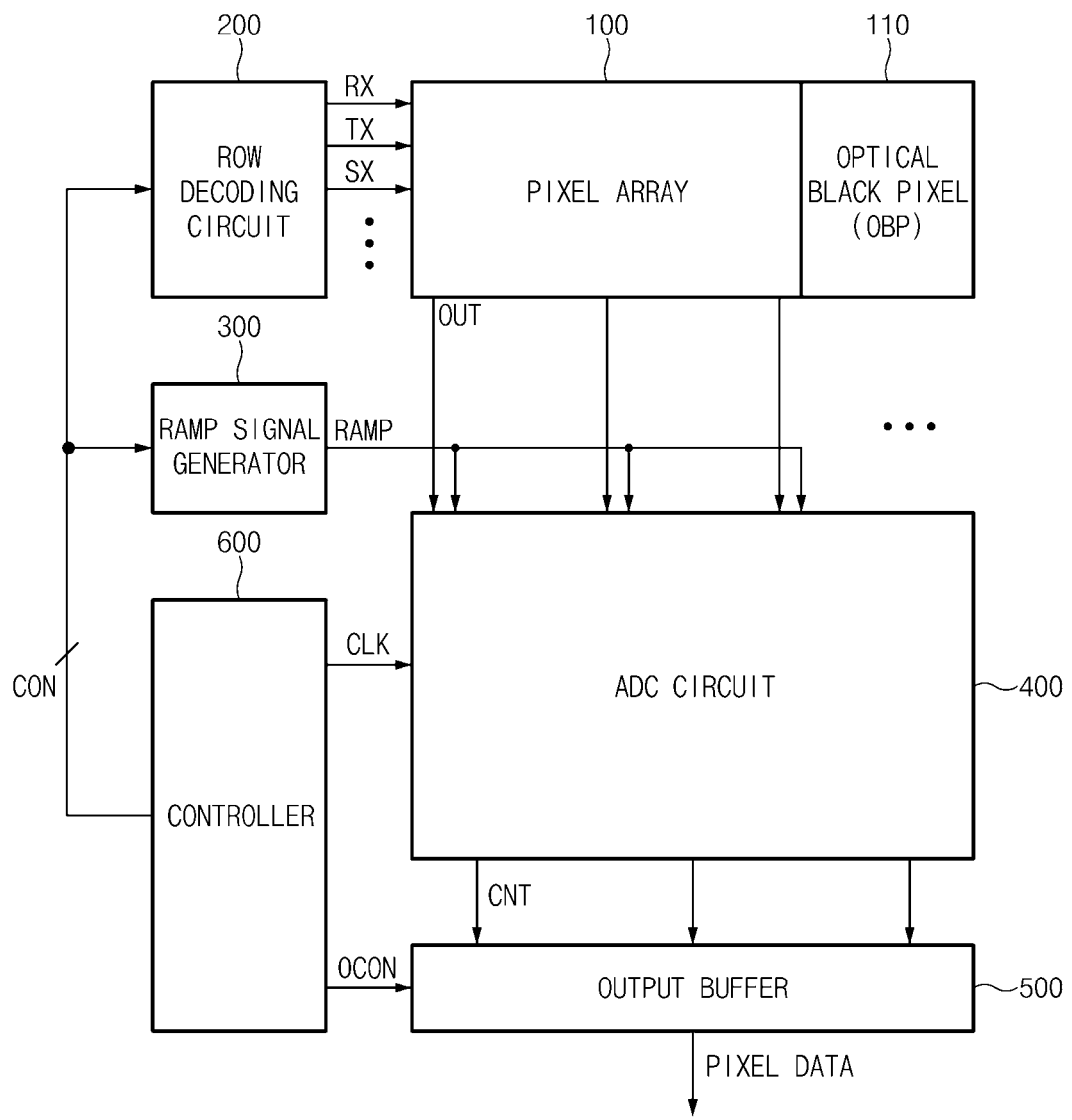
FIG. 1 illustrates an example of an image sensor including a ramp signal generator based on an embodiment of the disclosed technology.

FIG. 1 illustrates an example of an image sensor 10 based on an embodiment of the disclosed technology.

Referring to FIG. 1, the image sensor 10 may include a pixel array 100, an optical black pixel (OBP) 110, a row decoding circuit 200, a ramp signal generator 300, an analog-to-digital converter (ADC) circuit 400, an output buffer 500, and a controller 600.

The pixel array 100 may include imaging pixels that convert an incident light signal into an electrical signal, and may output a pixel signal OUT to the ADC circuit 400. The imaging pixels can be used to convert received incident light onto different imaging pixels into electrical charges or signals to represent images carried in the incident light. The imaging pixels can be semiconductor photosensors formed a substrate such as CMOS sensors. In some embodiments of the disclosed technology, the pixel array 100 may be driven by various drive signals such as a reset signal RX, a transmission signal TX, and a selection signal SX, which are generated by the row decoding circuit 200.

The dark current is a relatively small electric current that flows through an imaging pixel when no light is incident on the imaging pixel. Such a dark current in the image sensor can cause an undesired background noise in the final image signal. In some implementations, the image sensor can include shielded extra pixels for measuring dark currents in such shielded extra pixels. For example, the image sensor can include an optical black pixel (OBP) that is blocked from receiving incident light and is used for measuring the dark current. In this case, the optical black pixel (OBP) 110 may be disposed adjacent to one side of the pixel array 100. In some embodiments of the disclosed technology, the pixel array 100 includes a closely spaced matrix of active pixels 100 arranged in rows and columns, with optical black pixels 110 located at the end of each row of the active pixels. Such optical black pixels 100 may be used for measuring dark current where the optical black pixels 100 are placed in the dark and relatively small electric current flows through the optical black pixels. The optical black pixel (OBP) 110 may be used to compensate for an offset value of the pixel array 100 by using the dark current measured in a dark state.

In some other embodiments of the disclosed technology, the image sensor 10 may include extra pixels that are shielded and arranged next to the active pixels. For example, the optical black pixel (OBP) 110 may include an imaging pixel and a light shielding film over the imaging pixel to shield the imaging pixel from receiving incident light as a "black pixel." The optical black pixel (OBP) 110 may include at least one black pixel that can be selectively activated to measure the dark current, which can be used for reducing/removing noise from an output signal of each pixel.

The optical black pixel (OBP) 110 may be identical in structure to an active pixel embedded in the pixel array 100. The optical black pixel (OBP) 110 may determine an offset value of the corresponding active pixel using a plurality of unit pixels R, G, and B, with light-shielding layers (e.g., metal layer).

In some implementations, the optical black pixel (OBP) 110 may also prevent an image signal from being altered by temperature changes. In some implementations, the optical black pixel (OBP) 110 may include light-shielded unit pixels R, G, and B to output a constant reference signal, irrespective of incident light.

The row decoding circuit 200 may select at least one pixel for each row line of the pixel array 100 based on a control signal CON received from the controller 600 to control operations of the selected pixel.

The ramp signal generator 300 may generate a ramp signal RAMP in response to the control signal CON received from the controller 600, and may output the ramp signal RAMP to the ADC circuit 400. During generation of the ramp signal RAMP, the ramp signal generator 300 may precisely adjust an offset value of the ramp signal RAMP to reduce/minimize noise.

The ADC circuit 400 may convert an analog pixel signal OUT received from the pixel array 100 into a digital signal. The ADC circuit 400 may compare the pixel signal OUT received from the pixel array 100 with the ramp signal RAMP received from the ramp signal generator 300 to output a result of comparison between the pixel signal OUT and the ramp signal RAMP. The ADC circuit 400 may count the number of clock pulses CLK received from the controller 600 based on the result of comparison between the pixel signal OUT and the ramp signal RAMP, and may output a column-based counting signal CNT.

In an implementation of the disclosed technology, the ramp signal generator 300 may generate the ramp signal RAMP by linearly increasing or decreasing the voltage level of the ramp signal RAMP such that the voltage curve of the ramp signal RAMP has a positive or negative slope. The ramp signal generator 300 may feed the ramp signal RAMP to an input node of the ADC circuit 400, which receives the pixel signal OUT through another input node thereof. The ADC circuit 400 may count clock pulses during a period of time, for example, when the pixel signal is above the ramp signal.

The output buffer 500 may latch or hold the counting signal CNT received from the ADC circuit 400. The output buffer 500 may latch or hold counting information, and may sequentially output pixel data in response to an output control signal OCON.

The controller 600 may control the row decoding circuit 200, the ramp signal generator 300, the ADC circuit 400, and the output buffer 500. In this case, the controller 600 may include a timing generator. That is, the controller 600 may control overall procedure ranging from a process of sensing image data to a process of outputting the sensed image data based on timing information generated by the timing generator.

Figure 2:
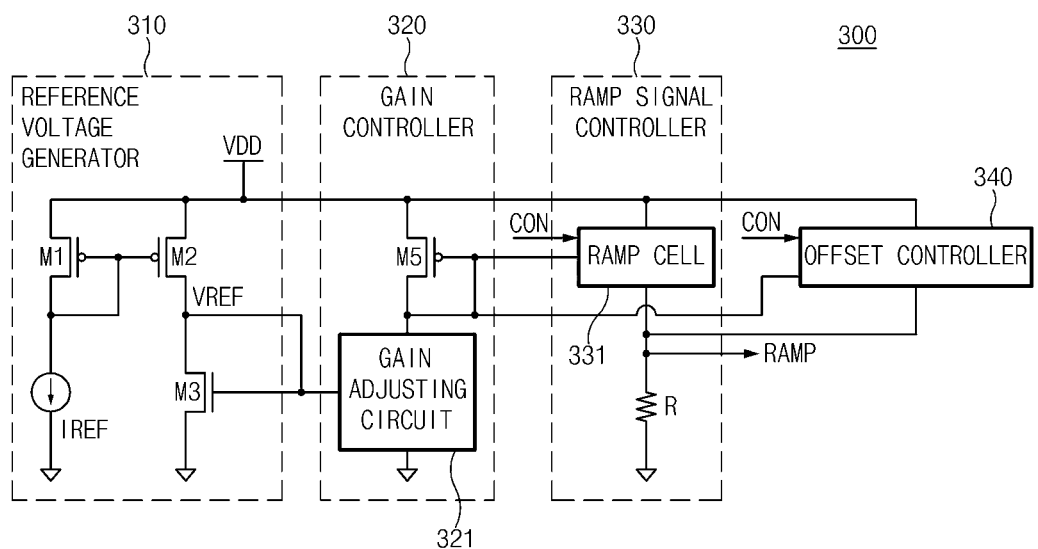
FIG. 2 illustrates an example of the ramp signal generator shown in FIG. 1.

FIG. 2 is a schematic diagram illustrating an example of the ramp signal generator 300 shown in FIG. 1.

Referring to FIG. 2, the ramp signal generator 300 may include a reference voltage generator 310, a gain controller 320, a ramp signal controller 330, and an offset controller 340.

In an embodiment of the disclosed technology, the reference voltage generator 310 may generate a reference voltage VREF. The reference voltage generator 310 may include a current source IREF and a plurality of transistors M1-M3.

The current source IREF may provide a reference current. The transistors M1 and M2 may be coupled in parallel to a power-supply voltage (VDD) input terminal, such that gate terminals of the transistors M1 and M2 may be coupled to each other. The transistors M1 and M2 may form a current mirror to copy the reference current flowing from the current source IREF to the transistor M1. The copied current flows through the transistor M2 and a diode-connected transistor M3 to output a reference voltage VREF to the gain controller 320. The transistor M3 may be coupled between the transistor M2 and a ground voltage terminal, such that the transistor M3 may receive the reference voltage VREF through gate and drain terminals thereof.

The gain controller 320 may control a gain of the reference voltage VREF received from the reference voltage generator 310. The gain controller 320 may include a transistor M5 and a gain adjusting circuit 321.

The transistor M5 may be coupled between the power-supply voltage (VDD) input terminal and the gain adjusting circuit 321, such that a gate terminal and a drain terminal of the transistor M5 may be coupled to each other. The transistor M5 may transmit a ramp bias voltage to the ramp signal generator 330 based on a gain adjusted by the gain adjusting circuit 321.

The gain adjusting circuit 321 may be coupled between the transistor M5 and the ground voltage terminal, such that the gain adjusting circuit 321 may adjust a gain of the reference voltage VREF. The gain adjusting circuit 321 may be coupled to the transistor M3 in the form of a current mirror. In some embodiments of the disclosed technology, the gain adjusting circuit 321 may include one or more transistors that can be used to adjust a current gain or a voltage gain by varying the current flowing therethrough and/or the voltage applied thereacross. For example, the gain adjusting circuit 321 may be implemented to adjust a necessary gain by changing the size of a transistor. The gain adjusting circuit 321 may generate a ramp bias voltage that is variable depending on the gain to transmit the generated ramp bias voltage to the ramp controller 330. In this way, the ramp bias voltage is fed to one or more transistors of the ramp controller 330 that are used to generate the ramp signal RAMP.

The ramp signal controller 330 may generate a ramp signal RAMP based on an output signal of the gain controller 320. The ramp signal controller 330 may include a ramp cell 331 and a resistor R.

The ramp cell 331 may be coupled between the power-supply voltage (VDD) input terminal and the resistor R. The ramp cell 331 may generate the ramp signal RAMP and may change the voltage level of the ramp signal RAMP based on the ramp bias voltage received from the gain controller 320 in response to the control signal CON. In this case, the control signal CON may be generated by the controller 600.

In an implementation, the ramp cell 331 may adjust the number of transistors to be connected in response to the control signal CON. For example, the ramp cell 331 may include a plurality of transistors and a plurality of switches that can be used to connect or disconnect power supplies (e.g., power supply voltage and ground voltage) to the plurality of transistors. The plurality of transistors can be turned on and off selectively by using the plurality of switches based on the control signal CON. In this way, the ramp cell 331 may generate the ramp signal RAMP by linearly increasing or decreasing the voltage level of the ramp signal RAMP such that the voltage curve of the ramp signal RAMP has a positive or negative slope. The ramp cell 331 may include a plurality of transistors coupled in parallel with each other. Each transistor can form a current mirror together with a transistor (e.g., M5) of the gain controller 320. The resistor R may be coupled between the ramp signal (RAMP) output terminal and the ground voltage terminal. The resistor R may be used to output the ramp signal RAMP generated by the ramp cell 331.

The offset controller 340 may be used to adjust an offset value of the ramp signal RAMP in response to an output signal of the gain controller 320. In some embodiments of the disclosed technology, the offset controller 340 may be coupled between the power-supply voltage (VDD) input terminal and the ramp signal (RAMP) output terminal to adjust the offset value of the ramp signal RAMP based on the output signal of the gain controller 320.

Ramp noise generated by each circuit of the ramp signal generator 300 shown in FIG. 2 may be contained in the ramp signal RAMP and is passed to the ADC circuit 400 through the resistor R. Noise caused by a reference current generated by the reference voltage generator 310 may be amplified due to, for example, a current transfer rate after passing through the gain controller 320, such that the amplified noise may be transmitted to an output terminal of the ramp signal generator 300. Likewise, all noise generated by the respective circuits constituting the ramp signal generator 300 may be contained in the ramp signal RAMP, and this may be one of the reasons why the resultant ramp signal RAMP having such noise may be transmitted to the ADC circuit 400.

Specifically, since quantization noise may occur in a low-gain period of the ADC circuit 400, a dark code histogram may be distorted in the ADC circuit 400 due to occurrence of the quantization noise, deteriorating noise characteristics. In order to address this issue, the ramp signal generator 300 implemented based on an embodiment of the disclosed technology may precisely adjust the offset value of the ramp signal RAMP using the offset controller 340, improving noise characteristics.

Figure 3:
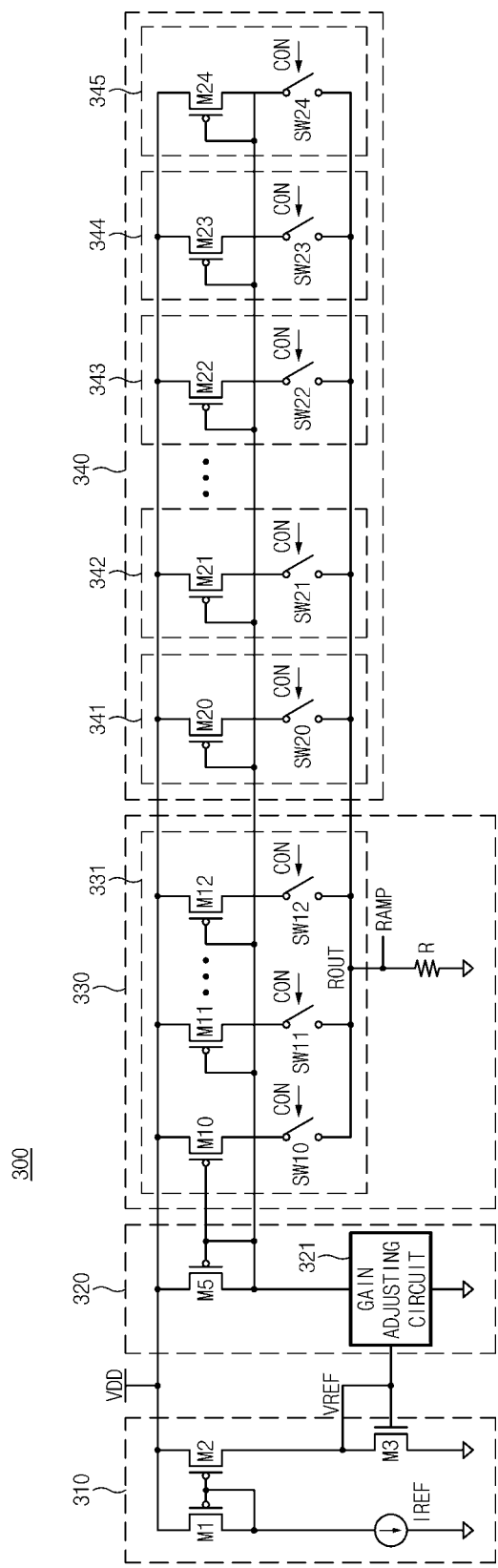
FIG. 3 illustrates an example of a ramp signal generator shown in FIG. 2.

FIG. 3 is a detailed circuit diagram illustrating an example of the ramp signal generator 300 shown in FIG. 2.

Like the ramp signal generator 300 illustrated in FIG. 2, the ramp signal generator 300 illustrated in FIG. 3 includes a reference voltage generator 310, a gain controller 320, a ramp signal controller 330, and an offset controller 340. The reference voltage generator 310 and the gain controller 320 illustrated in FIG. 3 are generally the same as the voltage generator 310 and the gain controller 320 described referring to FIG. 2, and thus a detailed description will be omitted.

Referring to FIG. 3, the ramp signal controller 330 may include the ramp cell 331 including a plurality of transistors M10-M12 and a plurality of switching elements SW10-SW12. The plurality of transistors M10-M12 may be coupled in parallel to the power-supply voltage (VDD) input terminal. In some embodiments of the disclosed technology, the plurality of transistors M10-M12 may be implemented as PMOS transistors. The plurality of transistors M10-M12 may have the same size (e.g., the same channel size).

By the way of example and not by limitation, FIG. 3 shows that the ramp cell 331 includes three transistors M10-M12 and three switching elements SW10-SW12. It should be noted that the number of transistors and the number of switching elements contained in the ramp cell 331 may vary.

The transistor M10 may be coupled between the power-supply voltage (VDD) input terminal and the switching element S10, such that a gate terminal of the transistor M10 may be coupled to a gate terminal of the transistor M5. The transistor M11 may be coupled between the power-supply voltage (VDD) input terminal and the switching element S11, such that the transistor M11 may receive an output signal of the gain controller 320 through a gate terminal thereof. The transistor M12 may be coupled between the power-supply voltage (VDD) input terminal and the switching element S12, such that the transistor M12 may receive an output signal of the gain controller 320 through a gate terminal thereof.

The switching element SW10 may be coupled between the transistor M10 and a ramp signal output terminal ROUT, such that the switching operation of the switching element SW10 may be controlled by a control signal CON. The switching element SW11 may be coupled between the transistor M11 and the ramp signal output terminal ROUT, such that the switching operation of the switching element SW11 may be controlled by the control signal CON. The switching element SW12 may be coupled between the transistor M12 and the ramp signal output terminal ROUT, such that the switching operation of the switching element SW12 may be controlled by the control signal CON.

The offset controller 340 may include a plurality of offset cells 341-345 coupled in parallel to the power-supply voltage (VDD) input terminal. Each of the offset cells 341-345 may be identical in structure to the ramp cell 331.

The offset controller 340 may be coupled to an output terminal of the gain controller 320. The offset controller 340 may allow the offset cells 341-345 to be selectively turned on in response to the control signal CON, such that the offset controller 340 may precisely control an offset value of the ramp signal RAMP. In more detail, the offset controller 340 may adjust the number of offset cells to be selectively turned on in response to the control signal CON, thereby precisely controlling the offset value of the ramp signal RAMP. In this case, the control signal CON may be generated by the controller 600. For example, the offset controller 340 may control a direct current (DC) level of the ramp signal RAMP. In this case, the control signal CON may be generated by the controller 600.

For convenience of description, it is assumed that the ramp signal generator 300 implemented based on some embodiments of the disclosed technology may sequentially turn on the plurality of offset cells 341-345 in ascending numerical order so as to adjust an offset value of the ramp signal RAMP. By way of example and not by limitation, the ramp signal generator 300 implemented based on some embodiments of the disclosed technology may turn on offset cells in ascending order the offset cell 341 to the offset cell 345. In some other embodiments of the disclosed technology, the ramp signal generator 300 may turn on offset cells in descending order from the offset cell 345 to the offset cell 341. However, the sequence of turning on the offset cells are not limited to the above described examples.

The offset cell 341 may include a transistor M20 and a switching element SW20. In this case, the transistor M20 may be coupled between the power-supply voltage (VDD) input terminal and the switching element SW20, such that the transistor M20 may receive an output signal of the gain controller 320 through a gate terminal thereof. The transistor M20 may be implemented as a PMOS transistor. The switching element SW20 may be coupled between the transistor M20 and the ramp signal output terminal ROUT, such that the switching operation of the switching element SW20 may be controlled by the control signal CON.

The offset cell 342 may include a transistor M21 and a switching element SW21. In this case, the transistor M21 may be coupled between the power-supply voltage (VDD) input terminal and the switching element SW21, such that the transistor M21 may receive an output signal of the gain controller 320 through a gate terminal thereof. The transistor M21 may be implemented as a PMOS transistor. The switching element SW21 may be coupled between the transistor M21 and the ramp signal output terminal ROUT, such that the switching operation of the switching element SW21 may be controlled by the control signal CON.

The offset cell 343 may include a transistor M22 and a switching element SW22. In this case, the transistor M22 may be coupled between the power-supply voltage (VDD) input terminal and the switching element SW22, such that the transistor M22 may receive an output signal of the gain controller 320 through a gate terminal thereof. The transistor M22 may be implemented as a PMOS transistor. The switching element SW22 may be coupled between the transistor M22 and the ramp signal output terminal ROUT, such that the switching operation of the switching element SW22 may be controlled by the control signal CON.

The offset cell 344 may include a transistor M23 and a switching element SW23. In this case, the transistor M23 may be coupled between the power-supply voltage (VDD) input terminal and the switching element SW23, such that the transistor M23 may receive an output signal of the gain controller 320 through a gate terminal thereof. The transistor M23 may be implemented as a PMOS transistor. The switching element SW23 may be coupled between the transistor M23 and the ramp signal output terminal ROUT, such that the switching operation of the switching element SW23 may be controlled by the control signal CON.

The offset cell 345 may include a transistor M24 and a switching element SW24. In this case, the transistor M24 may be coupled between the power-supply voltage (VDD) input terminal and the switching element SW24, such that the transistor M24 may receive an output signal of the gain controller 320 through a gate terminal thereof. The transistor M24 may be implemented as a PMOS transistor. The switching element SW24 may be coupled between the transistor M24 and the ramp signal output terminal ROUT, such that the switching operation of the switching element SW24 may be controlled by the control signal CON.

In some embodiments of the disclosed technology, the plurality of transistors M20~M24 respectively contained in the plurality of offset cells 341~345 may have the same size (e.g., the same channel size). In order to precisely adjust an offset value of the ramp signal RAMP, the transistors M20~M24 may be smaller in size than the transistors M10-M12 contained in the ramp cell 331.

For example, the channel size (i.e., a channel width and a channel length) of the transistors M20-M24 may be smaller than the transistors M10-M12 contained in the ramp cell 331. In an embodiment, the channel size (i.e., a channel width and a channel length) of the plurality of transistors M20-M24 may be predefined to correspond to a half the channel size of the transistors M10-M12 contained in the ramp cell 331.

Figure 4:
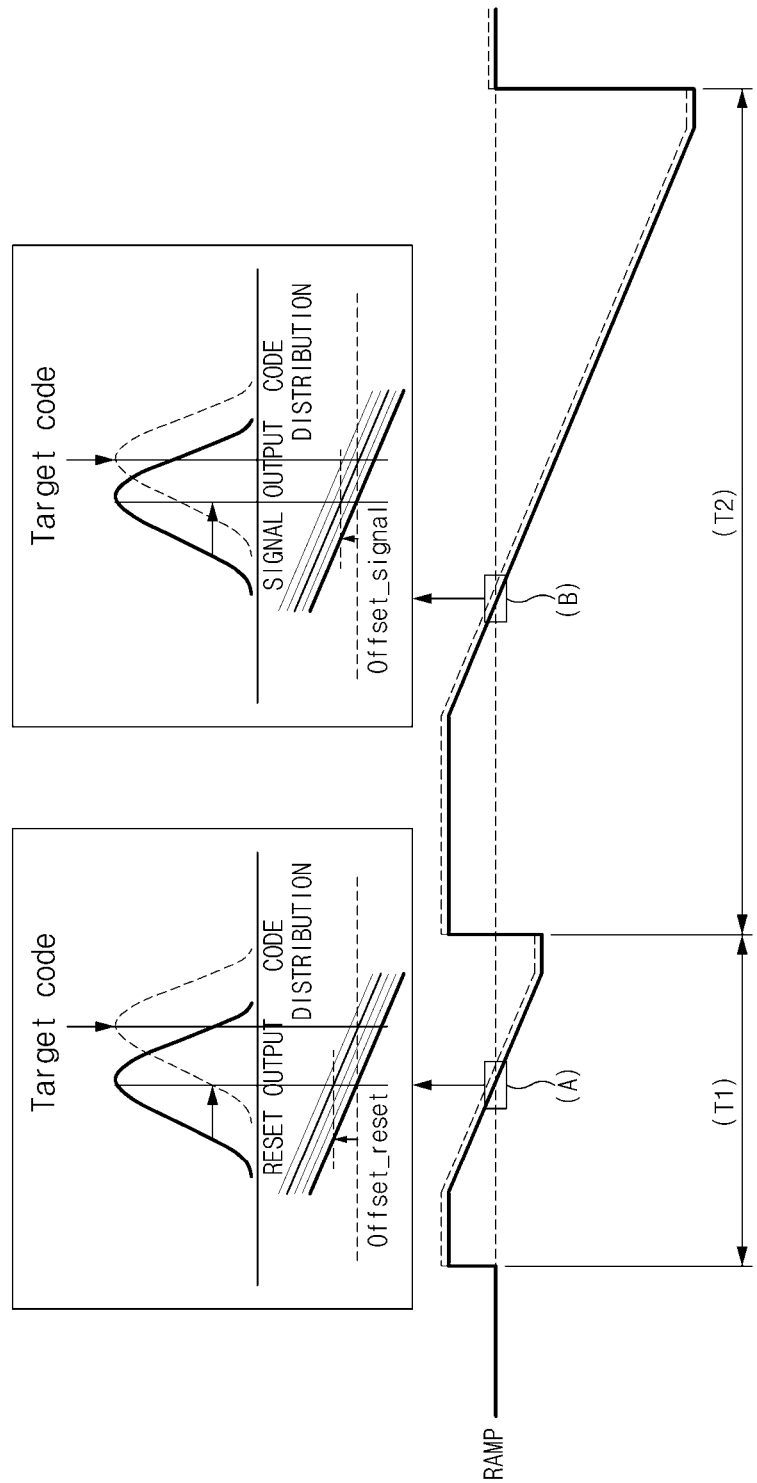
FIG. 4 illustrates examples of an offset change of the ramp signal generator shown in FIG. 3.

FIG. 4 illustrates examples of offset change of the ramp signal generator 300 shown in FIG. 3.

As discussed above, the correlated double sampling is a method to produce an accurate representation of an imaging pixel signal by differentiating the reset and signal values.

In FIG. 4, a crossing point denoted by "(A)" is enlarged to show a waveform diagram of the ramp signal RAMP in a reset period T1. The offset controller 340 may determine how many and in what sequence offset cells to be turned on from among total offset cells 341-345 in response to the control signal CON within the reset period T1. As can be seen from (A), the ramp signal generator 300 may precisely adjust an offset value (Offset_Reset) of the reset period T1, such that the ramp signal generator 300 may control code distribution of reset output values to be matched to a target code. In more detail, as can be seen from (A) of the reset period T1, the offset value (Offset_Reset) may be precisely adjusted, and a second value is chosen as a reset output value so that the resultant reset output value can be matched to a target code.

In FIG. 4, a crossing point denoted by "(B)" is enlarged to show a waveform diagram of the ramp signal RAMP in a signal period T2. The offset controller 340 may determine how many and in what sequence offset cells to be turned on from among total offset cells 341-345 in response to the control signal CON within the signal period T2. Therefore, as can be seen from (B), the ramp signal generator 300 may precisely adjust an offset value (Offset_Signal) of the signal period T2, such that a code distribution of signal output values is matched to a target code. In more detail, as can be seen from (B) of the signal period T2, the offset value (Offset_Signal) may be precisely adjusted, and a third value is chosen as a reset output value so that the resultant signal output value can be identical or similar to a target code.

That is, the ramp signal generator 300 implemented based on an embodiment of the disclosed technology may compensate for low current signal level the ramp signal RAMP can have at a low-gain period, such that the resultant current value to approach the target code.

In an embodiment, an offset value for use in the reset period T1 may be different from an offset value for use in the signal period T2. For example, where the offset value (Offset_Reset) for adjusting the reset signal is a second value as shown in FIG. 4(A), in the signal period T2, the offset value (Offset_Signal) for adjusting the signal is a third value as shown in FIG. 4(B). In another embodiment, the offset value of the reset period T1 may be identical to that of the signal period T2.

In each of the reset period T1 and the signal period T2, output values of the optical black pixel (OBP) 110 may be averaged every frame, such that the offset value of the reset period T1 and the offset value of the signal period T2 can be adjusted using the averaged OBP values. Thereafter, the averaged OBP values of the optical black pixel (OBP) 110 may be monitored by the ADC circuit 400, such that an offset value may be applied to a subsequent frame.

In an embodiment, the ADC circuit 400 may not monitor a value of the OBP 110 for use in the reset period T1 and a value of the OBP 110 for use in the signal period T2.

In another embodiment, an average code value obtained by averaging output values of the ADC circuit 400 is used to adjust only one of the offset value of the reset period T1 and the offset value of the signal period T2.

As is apparent from the above description, the ramp signal generator and the image sensor including the same implemented based on some embodiments of the disclosed technology may reduce noise that can occur at a low-gain period.

Only a few implementations and examples are described and other implementations, enhancements and variations can be made based on what is described and illustrated in this patent document.

What is claimed is:

1. A ramp signal generator comprising:
   a reference voltage generator configured to generate a reference voltage;
   a gain controller configured to control a gain of the reference voltage;
   a ramp signal controller configured to generate a ramp signal in response to an output signal of the gain controller; and
   an offset controller coupled to an output terminal of the gain controller to form a current mirror and configured to control an offset of the ramp signal in response to a control signal,
   wherein the offset controller includes a plurality of offset cells coupled in parallel between a power-supply voltage input terminal and an output terminal of the ramp signal, and selectively turned on in response to the control signal.

2. The ramp signal generator according to claim 1, wherein the ramp signal controller includes:
   a ramp cell configured to generate the ramp signal by controlling an output voltage level of the gain controller in response to the control signal; and
   a resistor coupled between the ramp cell and a ground voltage terminal.

3. The ramp signal generator according to claim 2, wherein the ramp cell is configured to generate the ramp signal by adjusting the number of transistors to be coupled in response to the control signal.

4. The ramp signal generator according to claim 2, wherein the ramp cell includes:
   a plurality of transistors coupled in parallel to a power-supply voltage (VDD) input terminal and configured to be selectively turned on in response to an output signal of the gain controller; and
   a plurality of switching elements coupled between the plurality of transistors and an output terminal of the ramp signal, and configured to be selectively switched by the control signal.

5. The ramp signal generator according to claim 4, wherein the plurality of transistors includes at least one PMOS transistor.

6. The ramp signal generator according to claim 4, wherein the plurality of transistors is configured to have the same channel size.

7. The ramp signal generator according to claim 1, wherein the offset controller is configured to control a direct current (DC) level of the ramp signal.

8. The ramp signal generator according to claim 1, wherein the plurality of offset cells is sequentially turned on.

9. The ramp signal generator according to claim 1, wherein each of the plurality of offset cells includes:
   a transistor coupled to the power-supply voltage input terminal, such that a gate terminal of the transistor is coupled to an output terminal of the gain controller; and
   a switching element coupled between the transistor and the output terminal of the ramp signal, such that a switching operation of the switching element is controlled by the control signal.

10. The ramp signal generator according to claim 9, wherein the transistors respectively contained in the plurality of offset cells are configured to have the same channel size.

11. The ramp signal generator according to claim 9, wherein the transistors respectively contained in the plurality of offset cells are structured to have a smaller channel size than transistors contained in the ramp signal controller.

12. The ramp signal generator according to claim 9, wherein the transistors respectively contained in the plurality of offset cells are structured to have a channel size that corresponds to a half a channel size of transistors contained in the ramp signal controller.

13. An image sensor comprising:
- a pixel array including imaging pixels arranged relative to one another in an array and configured to respond to incident light to output a plurality of pixel signals corresponding to received incident light;
- a ramp signal generator configured to generate a ramp signal; and
- an analog-to-digital converter (ADC) circuit in communication with the pixel array and the ramp signal generator and configured to convert the plurality of pixel signals into digital signals using the ramp signal, wherein the ramp signal generator includes
- a reference voltage generator configured to generate a reference voltage,
- a gain controller configured to control a gain of the reference voltage,
- a ramp signal controller configured to generate the ramp signal in response to an output signal of the gain controller, and
- an offset controller coupled to an output terminal of the gain controller to form a current mirror and configured to control an offset of the ramp signal in response to a control signal, wherein the offset controller includes a plurality of offset cells coupled in parallel between a power-supply voltage input terminal and an output terminal of the ramp signal, and selectively turned on in response to the control signal.

14. The image sensor according to claim 13, wherein the ramp signal controller includes:
- a ramp cell configured to generate the ramp signal by controlling an output voltage level of the gain controller in response to the control signal; and
- a resistor coupled between the ramp cell and a ground voltage terminal.

15. The image sensor according to claim 13, wherein each of the plurality of offset cells includes:
- a transistor coupled to the power-supply voltage input terminal, such that a gate terminal of the transistor is coupled to an output terminal of the gain controller; and
- a switching element coupled between the transistor and the output terminal of the ramp signal, such that a switching operation of the switching element is controlled by the control signal.

16. The image sensor according to claim 15, wherein the transistors respectively contained in the plurality of offset cells are structured to have the same channel size.

17. The image sensor according to claim 15, wherein the transistors respectively contained in the plurality of offset cells are structured to have a smaller channel size than transistors contained in the ramp signal controller.

18. The ramp signal generator according to claim 15, wherein the transistors respectively contained in the plurality of offset cells are structured to have a channel size that corresponds to a half a channel size of transistors contained in the ramp signal controller.

19. The image sensor according to claim 13, further comprising:
- a controller configured to generate the control signal using an average code value that is output from the analog-to-digital converter (ADC) circuit.

20. The ramp signal generator according to claim 13, wherein the plurality of offset cells is sequentially turned on.

* * * * *